(12) United States Patent
Sugaya

(10) Patent No.: US 8,878,358 B2
(45) Date of Patent: Nov. 4, 2014

(54) SEMICONDUCTOR DEVICE

(75) Inventor: Isao Sugaya, Kawasaki (JP)

(73) Assignee: Nikon Corporation, Tokyo (JP)

( * ) Notice: Subject to any disclaimer, the term of this patent is extended or adjusted under 35 U.S.C. 154(b) by 208 days.

(21) Appl. No.: 13/457,051

(22) Filed: Apr. 26, 2012

(65) Prior Publication Data

US 2012/0205792 A1 Aug. 16, 2012

Related U.S. Application Data

(63) Continuation of application No. 12/530,093, filed as application No. PCT/JP2008/053769 on Mar. 3, 2008, now Pat. No. 8,183,686.

(30) Foreign Application Priority Data

Mar. 6, 2007 (JP) ................................. 2007-055354
Mar. 30, 2007 (JP) ................................. 2007-091082

(51) Int. Cl.
| | | |
|---|---|---|
| H01L 23/34 | (2006.01) | |
| H01L 23/433 | (2006.01) | |
| H01L 25/18 | (2006.01) | |
| H01L 23/427 | (2006.01) | |

(52) U.S. Cl.
CPC ............ *H01L 23/4334* (2013.01); *H01L 25/18* (2013.01); *H01L 23/427* (2013.01); *H01L 2225/06589* (2013.01); *H01L 2924/15321* (2013.01)
USPC ........................................................ 257/714

(58) Field of Classification Search
CPC ... H01L 23/473; H01L 23/42; H01L 23/3121; H01L 23/367; H01L 23/04; H01L 23/043; H01L 23/22; H01L 23/26; H01L 23/296; H01L 24/29; H01L 24/01079; H01L 24/16227
USPC ......... 257/714, 718, 719, 720, 722, 706, 717, 257/712–713
See application file for complete search history.

(56) References Cited

U.S. PATENT DOCUMENTS 7,271,479 B2    9/2007    Zhao et al.

FOREIGN PATENT DOCUMENTS

| JP | 8-078616 | 3/1966 |
|---|---|---|
| JP | 63-36052 | 3/1988 |
| JP | 63-036052 | 3/1988 |
| JP | 7-235633 | 9/1995 |
| JP | 8-78616 | 3/1996 |
| JP | 8-78618 | 3/1996 |

(Continued)

OTHER PUBLICATIONS

Japanese Office Action and English-language translation of Notice of Reasons for Rejection Dated May 7, 2013, in corresponding Japanese application No. 2009-502573.

(Continued)

*Primary Examiner* — (Vikki) Hoa B Trinh
(74) *Attorney, Agent, or Firm* — Finnegan, Henderson, Farabow, Garrett & Dunner Ltd

(57) ABSTRACT

Between a logic LSI (4) arranged on one side of a DRAM (1) and jointed to the DRAM and a radiating member (6) arranged on the other side of the DRAM (1) for irradiating the heats of the DRAM (1) and the logic LSI (4), there is disposed a heat bypass passage (5), which extends inbetween while bypassing the DRAM (1). Thus, it is possible to provide a semiconductor device, which can irradiate the heat generated from the logic LSI such as CPU or GPU thereby to reduce the temperature rise and the temperature distribution.

28 Claims, 4 Drawing Sheets

(56) References Cited

FOREIGN PATENT DOCUMENTS

| JP | 8-078618 | 3/1996 |
|---|---|---|
| JP | 2002-110869 | 4/2002 |
| JP | 2005-005529 | 1/2005 |
| JP | 2005-166752 | 6/2005 |
| JP | 2006-210892 | 8/2006 |

OTHER PUBLICATIONS

International Search Report, Japanese Patent Office, May 21, 2008.

Korean Office Action of Korean Patent Application No. 10-2009-7019047 dated Apr. 30, 2014, 3 pages.

SEMICONDUCTOR DEVICE

This is a continuation of application Ser. No. 12/530,093, filed Sep. 4, 2009 which claims the benefit from prior Japanese Patent Application No. JP 2007-055354, filed in Japan on Mar. 6, 2007 and Japanese Patent Application No. JP 2007-091082, filed in Japan on Mar. 30, 2007, the entire contents of which are incorporated herein by reference.

TECHNICAL FIELD

The present invention relates to a semiconductor device.

BACKGROUND ART

Recently, in a semiconductor device such as an MPU, its speed depends on a data transfer speed between a logic LSI such as a CPU or a GPU and a memory such as a DRAM. In order to increase the data transfer speed, it is known that the logic LSI is disposed below the DRAM, and the DRAM and the logic LSI are connected, for example, through an interposer that is a wiring interface. In such a semiconductor device, a heat radiating member is disposed above the DRAM for radiating heat of the DRAM and the logic LSI. Heat generated from the logic LSI such as a CPU or a GPU is transferred to the heat radiating member through the interposer and the DRAM and then radiated from the heat radiating member.

DISCLOSURE OF THE INVENTION

However, when heat of the logic LSI is radiated, most of the heat is provided to the DRAM. If the temperature of the DRAM exceeds an allowable highest temperature, an abnormal operation occurs in the DRAM. If the temperature distribution of the DRAM spreads, element characteristics may vary according to the thermal stress. Elements may be damaged in extreme cases.

In view of the foregoing, one object of the invention is to provide a semiconductor device capable of efficiently radiating heat generated from a substrate such as a logic LSI while reducing the temperature rise and the temperature distribution.

In accordance with one aspect of the invention, a first substrate, a second substrate disposed on one side of the first substrate and joined to the first substrate, a heat radiating member disposed on the other side of the second substrate and radiating heat of each of the first and second substrates, and a heat bypass path extending between the first substrate and the heat radiating member while bypassing the second substrate therebetween are provided.

According to the present invention, a heat bypass path extending between the first substrate and the heat radiating member while bypassing the second substrate therebetween is provided. Therefore, most of heat generated in the second substrate is transferred through the heat bypass path to the heat radiating member without being transferred to the first substrate. When the first substrate is, for example, a DRAM and the second substrate is, for example, a logic LSI such as a CPU or a GPU, it is surely suppressed that the temperature of the DRAM exceeds an allowable value and the temperature distribution spreads due to the heat generated from the logic LSI. Thus, an abnormal operation and/or element characteristics variation, which conventionally occur by the heat of the logic LSI being provided to the DRAM, are surely suppressed.

EXPLANATIONS OF LETTERS OR NUMERALS 1 second substrate (DRAM)
2 protection member (overmold)
3 interposer
4 first substrate (logic LSI)
5 heat bypass path
6 heat radiating member (heat radiating fin)
7 heat transfer liquid

BEST MODE FOR CARRYING OUT THE INVENTION

Figure 1:
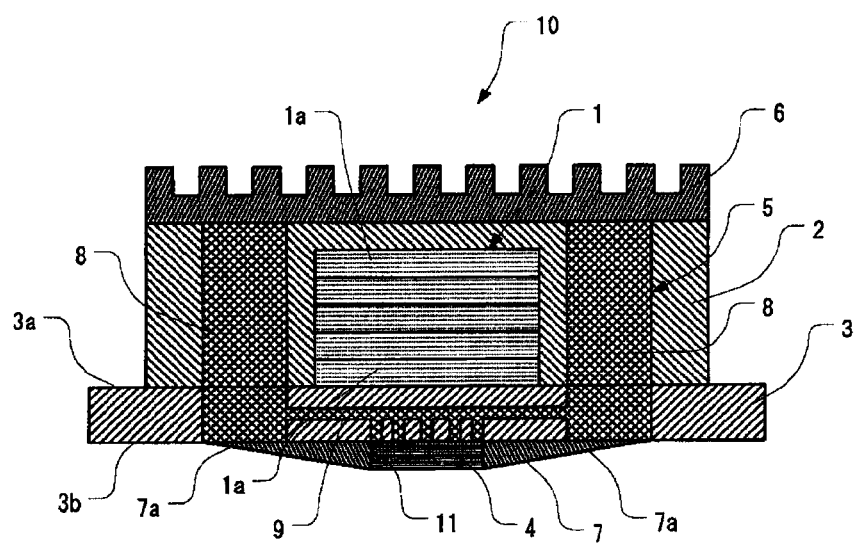
FIG. 1 is a view schematically showing a semiconductor device according to a first embodiment of the present invention.

Exemplary embodiments of the present invention will be described below with reference to the drawings. FIG. 1 shows a first embodiment according to the present invention, in which the present invention is applied to a semiconductor device 10 having a three-dimensional structure. The semiconductor device 10 according to this embodiment comprises a DRAM 1, which is a first substrate, as shown in FIG. 1.

The DRAM 1 has five stacked sheets of semiconductor chips each on which a DRAM circuit pattern (not shown in the figure) is formed. Each semiconductor chip 1a is formed by separating a wafer (not shown in the figure) of silicon into a plurality of regions each on which a circuit pattern is formed.

A bottom-layer semiconductor chip 1a in the plurality of semiconductor chips 1a that structure the DRAM 1 is fixed on an upper surface 3a of an interposer 3 disposed under the semiconductor chip 1a. A logic LSI 4 such as a CPU or a GPU, which is a second substrate, is fixed on a lower surface 3b of the interposer 3. Thus, the DRAM 1 and the logic LSI 4 are joined to each other through the interposer 3. In the example of the figure, the logic LSI 4 has a single semiconductor chip. The interposer 3 is, as well known, a rewiring substrate for adjusting the wiring pitch between the DRAM 1 and the logic LSI 4.

The semiconductor device 10 comprises an overmold 2, which is a protection member for protecting the DRAM 1. The overmold 2 is formed from, for example, epoxy resin and ceramic, and is disposed to surround the upper and side portions of the DRAM 1. The thermal conductivity of the overmold 2 is 0.7 W/m° C. in the example of the figure.

On the overmold 2, a heat radiating member for radiating heat of the DRAM 1 and the logic LSI 4 is disposed. In the example of the figure, the heat radiating member is structured as a heat radiating fin 6. The heat radiating fin 6 is formed from, for example, metal and ceramic.

In the semiconductor device 10 according to this embodiment, a heat bypass path 5 is provided to extend between the logic LSI 4 and the heat radiating fin 6 while bypassing the DRAM 1 therebetween.

The heat bypass path 5 has a first bypass part 7, a second bypass part 8, and a third bypass part 9. Each of the first bypass part 7, second bypass part 8 and third bypass part 9 is formed from, for example, copper or aluminum. In the case where each bypass part 7, 8, 9 is formed from copper, each thermal conductivity is 392 Wm° C.

In the example of the figure, the first bypass part 7 has a circular plate shape, and is disposed on the lower surface 3b of the interposer 3. At the center of the first bypass part 7, a fitting hole 11 into which the logic LSI 4 is fitted is formed.

In the example of the figure, one end of the second bypass part 8 is connected to a peripheral edge portion 7a of the first bypass part 7. The second bypass part 8 has a tubular shape extending from the peripheral edge portion 7a through the inside of the interposer 3 and the overmold 2 toward the heat radiating fin 6 while surrounding the DRAM 1. The other end or upper end of the second bypass part 8 is in contact with the heat radiating fin 6.

The third bypass part 9 extends upward inside the interposer 3 from the logic LSI 4 and further extends through the inside of the interposer 3 toward the second bypass part 8.

A portion of the second bypass part 8 within the interposer 3 and the third bypass part 9 are formed in the interposer 3 in a similar way to the method for forming a wiring pattern in the interposer 3. In order to form a portion of the second bypass part 8 within the overmold 2, when the overmold 2 is formed by molding, a material forming the said portion of the second bypass part 8 is poured, together with a material forming the overmold 2 and the DRAM 1, into the mold and then hardened.

The DRAM 1 is filled with an underfill of resin, and one or more thermal vias for heat transfer between the semiconductor chips 1a are provided, which are omitted in the figure. Wiring patterns are formed in the interposer 3 and the stack DRAM 1, which are also omitted in the figure.

A portion of heat generated in the logic LSI 4 is transferred from the upper surface of the logic LSI 4 to the third bypass part 9 and then through the third bypass part 9 to the second bypass part 8 in FIG. 1. A portion of heat generated in the logic LSI 4 is also transferred from the logic LSI 4 to the first bypass part 7 and then through the first bypass part 7 to the second bypass part 8. Heat transferred to the second bypass part 8 is transferred to the heat radiating fin 6 and then radiated from the heat radiating fin 6. That is, heat generated in the logic LSI 4 is transferred to the heat radiating fin 6 in such a manner as to bypass the DRAM 1. Because heat of the logic LSI 4 is hard to be transferred to the DRAM 1, the temperature rise and the temperature distribution in the DRAM 1 can be reduced.

Thus, because it is suppressed that heat is provided to the DRAM having a stacked structure within which heat is easily confined as compared to a single semiconductor chip, it is surely suppressed that the temperature of the DRAM 1 exceeds an allowable value and the temperature distribution of the DRAM 1 spreads due to the confinement of heat in the DRAM 1. Therefore, an abnormal operation and/or element characteristics variation, which conventionally occur by the heat of the logic LSI 4 being provided to the DRAM 1, are surely suppressed.

Figure 2:
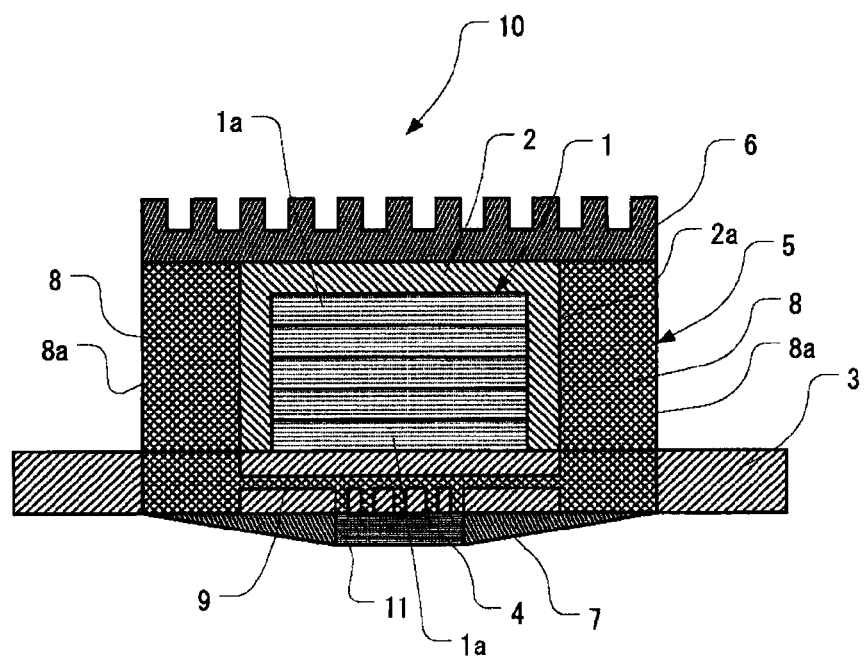
FIG. 2 is a view schematically showing a semiconductor device according to a second embodiment of the present invention.

FIG. 2 schematically shows the semiconductor device 10 according to a second embodiment of the present invention. In the following drawings, the same reference numerals are used for the same components shown in the foregoing drawings and the description thereof may be omitted.

In this embodiment, the second bypass part 8 of the heat bypass path 5 is not formed inside the overmold 2, but is formed on an outer surface 2a of the overmold 2. This structure can be formed by fitting the second bypass part 8 on the outside of the overmold 2 after the overmold 2 is formed.

According to the example shown in FIG. 2, most of the outer peripheral surface 8a of the second bypass part 8 is in contact with the atmosphere. Therefore, heat transferred to the second bypass part 8 from the LSI logic 4 can be radiated from the second bypass part 8 to the external of the semiconductor device 10 in addition to the heat radiation from the heat radiating fin 6 to the external of the semiconductor device 10. Thus, the heat of the LSI logic 4 can be efficiently radiated.

The embodiment shown in FIG. 1 and the embodiment shown in FIG. 2 may be combined to form the second bypass part 8 both inside and on a surface of the overmold 2, thereby increasing the heat transfer area.

Figure 3:
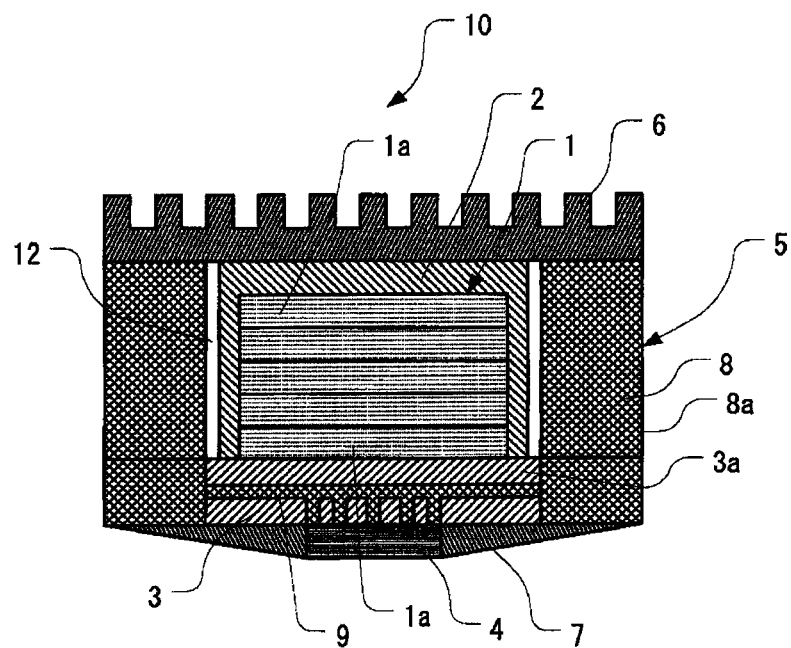
FIG. 3 is a view schematically showing a semiconductor device according to a third embodiment of the present invention.

FIG. 3 schematically shows the semiconductor device 10 according to a third embodiment of the present invention. In this embodiment, a portion of the second bypass part 8 of the heat bypass path 5 is not formed inside the interposer 3, but is formed on an outer surface 3a of the interposer 3. The second bypass part 8 is disposed in such a manner as to form a gap 12 between a portion of the second bypass part 8 and the overmold 2. This structure can be formed by fitting the portion of the second bypass part 8 on the outside of the interposer 3 after the interposer 3 is formed.

According to the example shown in FIG. 3, because the outer peripheral surface 8a of the second bypass part 8 is entirely in contact with the atmosphere, heat of the LSI logic 4 can be efficiently radiated.

Because the gap 12 is formed between the second bypass part 8 and the overmold 2, it is prevented that heat transferred to the second bypass part 8 from the logic LSI 4 is transferred to the overmold 2.

The embodiment shown in FIG. 1 and the embodiment shown in FIG. 3 may be combined to form the second bypass part 8 both inside and on a surface of the interposer 3, thereby increasing the heat transfer area.

Figure 4:
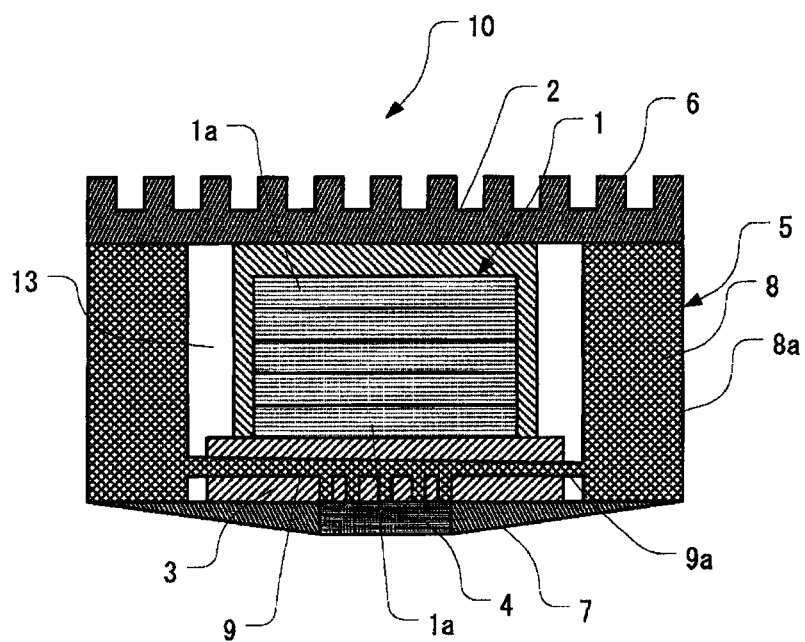
FIG. 4 is a view schematically showing a semiconductor device according to a fourth embodiment of the present invention.

FIG. 4 shows schematically shows the semiconductor device 10 according to a fourth embodiment of the present invention. In this embodiment, the second bypass part 8 of the heat bypass path 5 is formed in such a manner that a gap 13 is formed between the second bypass part 8 and the overmold 2/interposer 3. Ends 9a of the third bypass part 9 protrude from the peripheral surface 3a of the interposer 3. This structure can be formed by disposing the second bypass part 8 to surround the overmold 2 and the interposer 3 after the overmold 2 and the interposer 3 are formed and connecting the ends 9a of the third bypass part 9 to the second bypass part 8.

According to the example of FIG. 4, because the outer peripheral surface 8a of the second bypass part 8 is entirely in contact with the atmosphere, heat of the LSI logic 4 can be efficiently radiated.

Because the gap 13 is formed between the second bypass part 8 and the overmold 2/interposer 3, it is prevented that heat transferred to the second bypass part 8 from the logic LSI 4 is transferred to the overmold 2 and the interposer 3.

The embodiment shown in FIG. 1 and the embodiment shown in FIG. 4 may be combined to form the second bypass part 8 further inside the overmold 2 and the interposer 3, thereby increasing the heat transfer area.

In the embodiments shown in FIG. 1 through FIG. 4, an example where the heat radiating fin 6 is disposed on the overmold 2 is shown. Alternatively, the heat radiating fin 6 may be disposed above the top-layer semiconductor chip 1a in the plurality of stacked semiconductor chips 1a so that the heat radiating fin 6 is joined to the top-layer semiconductor chip 1a. In this case, the heat radiating fin 6 may be joined to the top-layer semiconductor chip 1a by, for example, adhesive. In the stacking process for the plurality of semiconductor chips 1a, the heat radiating fin 6 is used as one layer and the heat radiating fin 6 can be joined by stacking the heat radiating fin 6 on the top-layer semiconductor chip 1a.

Thus, the heat radiating fin 6 can be easily assembled by joining the heat radiating fin 6 to the DRAM 1 in the above stacking process.

In the embodiments shown in FIG. 1 through FIG. 4, one or more thermal vias penetrating the plurality of semiconductor chips 1a, as described above, can be joined to the heat radiating fin 6. Thus, even if a portion of heat of the logic LSI 4 is transferred to the DRAM 1, this heat can be easily transferred through the thermal vias to the heat radiating fin 6. Therefore, heat of the DRAM 1 can be easily radiated.

In the embodiments shown in FIG. 1 through FIG. 4, the heat bypass path 5 may not be a solid such as copper or aluminum. The heat bypass path 5 may be structured to have a hollow or to be a tube which is filled with a liquid that is a heat transfer medium. If a liquid is used as the heat transfer medium forming the heat bypass path 5, heat transfer is also made by the natural convection, thereby increasing the heat radiation efficiency. If the heat bypass path 5 is structured with a liquid and a solid, heat transfer can be made by the liquid-solid transformation, thereby increasing the heat radiation efficiency. Furthermore, the first bypass part 7 of the heat bypass path 5 may be formed to be a hollow shape whose upper portion is open, and a liquid that is a heat transfer medium may be inserted into the hollow, thereby increasing the heat transfer performance. In the following, examples where a liquid is used in a part or the entire of the heat bypass path.

Figure 5:
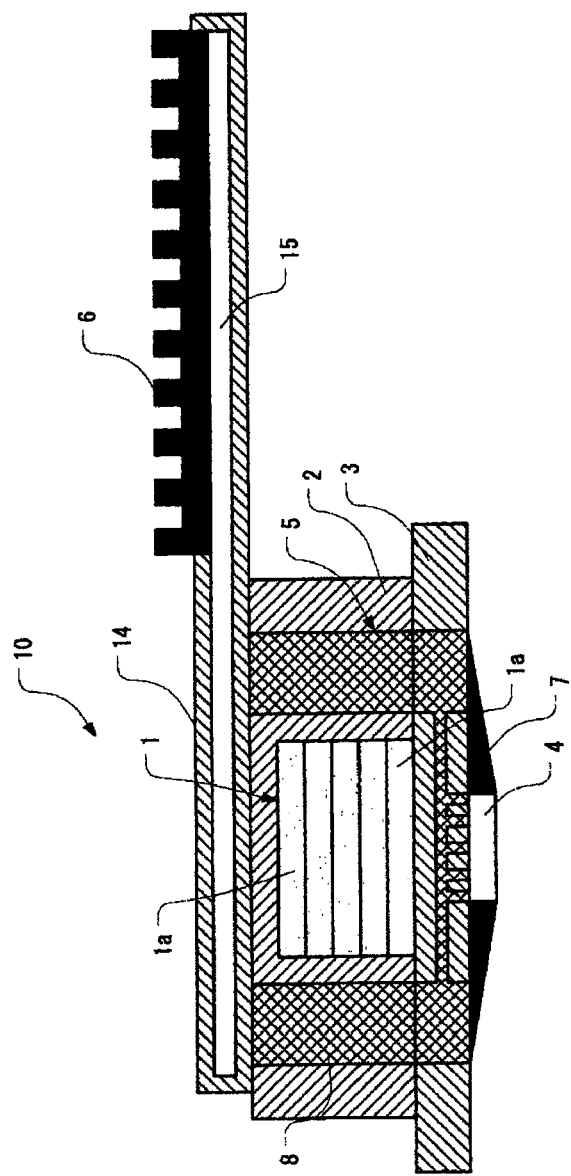
FIG. 5 is a view schematically showing a semiconductor device according to a fifth embodiment of the present invention.

FIG. 5 schematically shows the semiconductor device 10 according to a fifth embodiment of the present invention. In this embodiment, a case member 14 is disposed between the DRAM 1 and the heat radiating fin 6. In the example of the figure, the case member 14 is formed from metal. The case member 14 is disposed on the surface of the overmold 2 and extends from over the overmold 2 toward the side of the overmold 2. The case member 14 is filled with a heat transfer liquid 15 that is a heat medium. The heat radiating fin 6 is provided in a protruding portion of the case member 14 from the overmold 2. A lower surface 6a of the heat radiating fin 6 is exposed to inside the case member 14 and is in contact with the heat transfer liquid 15. The second bypass part 8 of the heat bypass path 5 is connected to the case member 14.

Heat of the logic LSI 4 transferred to the heat bypass path 5 is transferred through the heat bypass path 5 to the case member 14, and then to the heat transfer liquid 15 within the case member 14. Thereafter, the heat is further transferred from the heat transfer liquid 15 to the heat radiating fin 6 and then is radiated.

According to the example shown in FIG. 5, the heat radiating fin 6 is not disposed above the overmold 2, but is disposed in the protruding portion of the case member 14 from the overmold 2. Therefore, the semiconductor device 10 having a structure shown in FIG. 5 can be employed so as to address the case where the heat radiating fin 6 cannot be disposed above the overmold 2.

Figure 6:
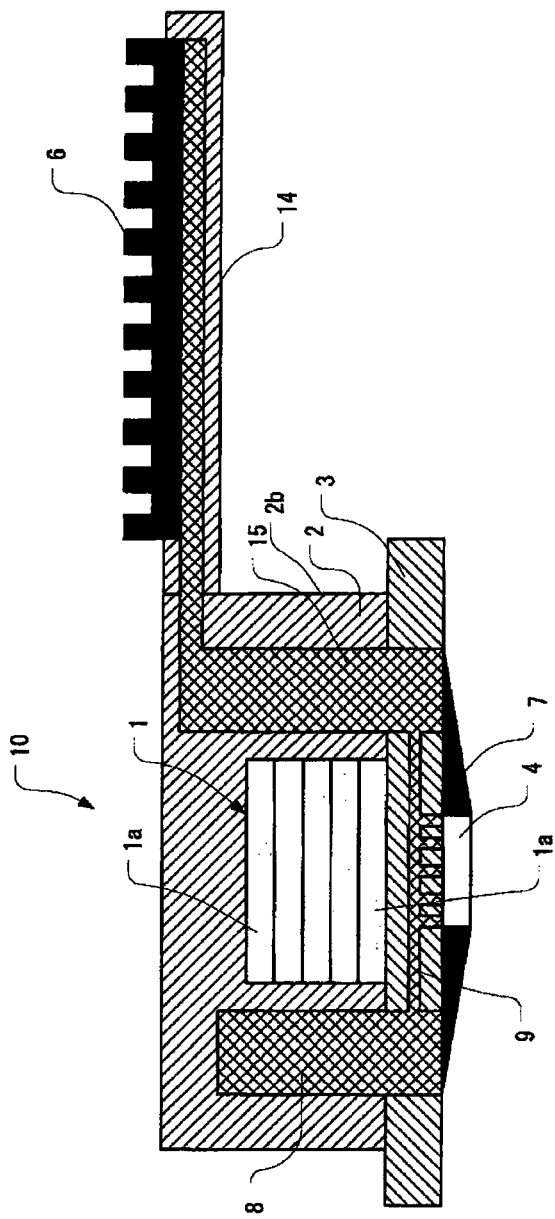
FIG. 6 is a view schematically showing a semiconductor device according to a sixth embodiment of the present invention.

FIG. 6 schematically shows the semiconductor device 10 according to a sixth embodiment of the present invention. In this embodiment, the second bypass part 8 and the third bypass part 9 of the heat bypass path 5 are filled with a heat transfer liquid 15. The case member 14 is provided on a side surface 2b of the overmold 2. The inside of the third bypass part 9 and the inside of the case member 14 are in communication with each other. Heat from the logic LSI 4 is transferred through the first bypass part 7 or the heat transfer liquid 15 within the third bypass part 9 to the second bypass part 8. The heat transferred to the second bypass part 8 is transferred through the heat transfer liquid 15 within the second bypass part 8 to the heat radiating fin 6 and then radiated.

As described above, the first bypass part 7 of the heat bypass path 5 may be formed to be a hollow shape whose upper portion is open. The first bypass part 7 is connected to the second bypass part 8 and a liquid that is a heat transfer medium is poured into the first bypass part 7, thereby increasing the heat transfer performance. In this case, the entire of the heat transfer path is structured with the liquid.

According to the examples shown in FIGS. 1 through 6, the logic LSI 4 is disposed below the DRAM 1, and the logic LSI and the DRAM 1 are connected with each other through the interposer 3.

In general, the size of the logic LSI 4 is smaller than the size of the DRAM 1. When the semiconductor device 10 is mounted on another substrate, a plurality of terminals called bumps (not shown in the figure) are provided on the lower surface 3b of the interposer 3 so that each bump 3 is connected to the said substrate.

Therefore, in the case where the logic LSI 4 is provided on the lower surface 3b of the interposer 3 as shown in the above embodiments, the lower surface 3b of the interposer 3 has a region in which a plurality of bumps are disposed even if the size of the interposer 3 is almost equal to the size of the DRAM 1.

However, in the case where the logic LSI 4 is disposed on the upper surface 3a of the interposer 3 and the DRAM 1 is disposed on the lower surface 3b of the interposer 3, there is no region in which a plurality of bumps are disposed in the lower surface 3b of the interposer 3 if the size of the interposer 3 is almost equal to the size of the DRAM 1. In order to dispose the plurality of bumps, it is required that the size of the interposer 3 is larger than the size of the DRAM 1. That is, it is required to increase the size of the interposer 3 as compared to the case where the logic LSI 4 is disposed on the lower surface 3b of the interposer 3.

Thus, in the case where the logic LSI 4 is provided on the lower surface 3b of the interposer 3 as shown in the above embodiments, the entire semiconductor device 10 can be downsized as compared to the case where the logic LSI 4 is provided on the upper surface 3a of the interposer 3.

In the examples shown in FIG. 1 through FIG. 6, the DRAM 1 has a plurality of semiconductor chips 1a. Alternatively, the DRAM having a single semiconductor chip 1a can be applied to the present invention. Furthermore, in the above examples, the logic LSI 4 has a single semiconductor chip. Alternatively, the logic LSI having a plurality of semiconductor chips can be applied to the present invention.

In the examples shown in FIG. 1 through FIG. 6, the semiconductor device 10 comprises the DRAM 1. In place of, or in addition to this, the present invention can be applied to a semiconductor device comprising a substrate such as a CPU or a GPU other than the DRAM 1. In such a case, a CPU and a GPU can be formed by stacking a plurality of semiconductor chips as the DRAM 1 shown in the above embodiments.

The invention claimed is:

1. A semiconductor device comprising:
   a first substrate;
   a second substrate disposed on a first side of the first substrate and electrically connected to the first substrate;
   a heat radiating member disposed on a second side of the first substrate and radiating heat of each of the first and second substrates, the second side opposing the first side; and
   a heat bypass path for transferring heat of the second substrate to the heat radiating member, a first end of the heat bypass path being in direct contact with the second substrate and a second end of the heat bypass path being in direct contact with the heat radiating member.

2. The semiconductor device according to claim 1, wherein the first substrate comprises a plurality of stacked semiconductor chips.

3. A semiconductor device comprising:
   a first substrate comprising a plurality of stacked semiconductor chips;
   a second substrate disposed on a first side of the first substrate and electrically connected to the first substrate;
   a heat radiating member disposed on a second side of the first substrate and radiating heat of each of the first and second substrates, the second side opposing the first side; and
   an interposer disposed between the first substrate and the second substrate; and
   a heat bypass path extending from the second substrate to the heat radiating member while bypassing the first substrate, a portion of the heat bypass path being disposed within the interposer,
   wherein the second substrate generates heat.

4. The semiconductor device according to claim 1 or 3, wherein the second substrate generates heat.

5. The semiconductor device according to claim 1 or 3, wherein the second substrate is a logic LSI device.

6. The semiconductor device according to claim 1 or 3, wherein the first substrate is a DRAM device.

7. The semiconductor device according to claim 1 or 3, wherein the heat bypass path and the first substrate are not in contact with each other.

8. The semiconductor device according to claim 1 or 3, further comprising a member having a thermal conductivity lower than a thermal conductivity of the heat bypass path, the member being provided between the first substrate and the heat bypass path.

9. The semiconductor device according to claim 1 or 3, wherein the heat bypass path has a tubular shape formed so as to surround the first substrate.

10. The semiconductor device according to claim 1 or 3, further comprising a protection member provided so as to at least partially surround the first substrate,
    wherein the heat bypass path is disposed on a surface of the protection member.

11. The semiconductor device according to claim 10, wherein a thermal conductivity of the heat bypass path is higher than a thermal conductivity of the protection member.

12. The semiconductor device according to claim 10, wherein the protection member is provided so as to at least partially surround the first substrate and such that a gap is formed between the heat bypass path and the protection member.

13. The semiconductor device according to claim 11 or 3, further comprising a protection member disposed to surround at least a side surface of the second substrate,
    wherein the heat bypass path is provided at least one of inside or on a surface of the protection member, the heat bypass path being formed from a material having a thermal conductivity higher than a thermal conductivity of the protection member.

14. The semiconductor device according to claim 13,
    wherein the heat bypass path is arranged such that a gap is formed between the heat bypass path and the protection member.

15. The semiconductor device according to claim 1 or 3, further comprising a rewiring substrate for connecting the first and second substrates, the rewiring substrate being disposed between the first and second substrates,
    wherein a part of the heat bypass path is provided at least one of inside or on a surface of the rewiring substrate.

16. The semiconductor device according to claim 1 or 3, further comprising a rewiring substrate for connecting the first and second substrates, the rewiring substrate being disposed between the first and second substrates,
    wherein a gap is formed between the heat bypass path and the rewiring substrate.

17. The semiconductor device according to claim 1 or 3, further comprising an interposer disposed between the first substrate and the second substrate and connecting the first and second substrates with each other,
    wherein a part of the heat bypass path is provided at least one of inside or on a surface of the interposer.

18. The semiconductor device according to claim 17,
    wherein the heat bypass path is arranged such that a gap is formed between the heat bypass path and the interposer.

19. The semiconductor device according to claim 1 or 3, wherein the heat bypass path is a solid.

20. The semiconductor device according to claim 1 or 3, wherein a liquid is sealed in at least a part of the heat bypass path.

21. The semiconductor device according to claim 1 or 3, further comprising a case member in which a liquid is sealed, the case member being disposed between the first substrate and the heat radiating member,
    wherein the heat bypass path is connected to the case member.

22. The semiconductor device according to claim 1 or 3, wherein at least one of the first substrate or the second substrate has a plurality of stacked semiconductor chips.

23. The semiconductor device according to claim 1 or 3, further comprising:
    an interposer disposed between the first substrate and the second substrate, and electrically connecting the first and the second substrates to each other,
    wherein the heat bypass path comprises:
    a first heat bypass part disposed within the interposer, and
    a second heat bypass part having a first end connected to the first heat bypass part and a second end in contact with the heat radiating member.

24. The semiconductor device according to claim 23, further comprising a protection member disposed to surround at least a side surface of the first substrate,
    wherein the second heat bypass part is provided at least one of inside or on a surface of the protection member, the second heat bypass part being formed from a material having a thermal conductivity higher than a thermal conductivity of the protection member.

25. The semiconductor device according to claim 24, wherein the second heat bypass part is disposed such that a gap is formed between the second heat bypass part and the protection member.

26. The semiconductor device according to claim 23, wherein the heat bypass path further comprises a plurality of third heat bypass parts extending between the second substrate and the first heat bypass part, the third heat bypass parts being disposed within the interposer.

27. The semiconductor device according to claim 26, wherein a gap is formed between the second heat bypass path and the interposer.

28. The semiconductor device according to claim 1 or 3, wherein the first substrate is a memory device and the second substrate is a logic LSI device.

* * * * *